United States Patent
Bansal et al.

(10) Patent No.: US 10,570,517 B2
(45) Date of Patent: Feb. 25, 2020

(54) APPARATUS AND METHOD FOR UV TREATMENT, CHEMICAL TREATMENT, AND DEPOSITION

(71) Applicant: Applied Materials, Inc., Santa Clara, CA (US)

(72) Inventors: Amit Bansal, Sunnyvale, CA (US); Dale R. Du Bois, Los Gatos, CA (US); Juan Carlos Rocha-Alvarez, San Carlos, CA (US); Sanjeev Baluja, Campbell, CA (US); Scott A. Hendrickson, Brentwood, CA (US); Thomas Nowak, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 288 days.

(21) Appl. No.: 15/184,675

(22) Filed: Jun. 16, 2016

(65) Prior Publication Data
US 2016/0289838 A1 Oct. 6, 2016

Related U.S. Application Data

(62) Division of application No. 13/440,720, filed on Apr. 5, 2012.
(Continued)

(51) Int. Cl.
*C23C 16/56* (2006.01)
*C23C 16/44* (2006.01)
(Continued)

(52) U.S. Cl.
CPC .......... *C23C 16/56* (2013.01); *C23C 16/0272* (2013.01); *C23C 16/4401* (2013.01);
(Continued)

(58) Field of Classification Search
None
See application file for complete search history.

(56) References Cited

U.S. PATENT DOCUMENTS

| 3,983,039 A | 9/1976 | Eastland |
| 4,135,098 A | 1/1979 | Troue |

(Continued)

FOREIGN PATENT DOCUMENTS

| CN | 101350293 A | 1/2009 |
| JP | H04-505347 A | 9/1992 |

(Continued)

OTHER PUBLICATIONS

Japanese Office Action dated Mar. 1, 2016 for Application No. 2014-503984.
(Continued)

*Primary Examiner* — Karla A Moore
(74) *Attorney, Agent, or Firm* — Patterson + Sheridan LLP

(57) ABSTRACT

Embodiments of the present invention provide apparatus and methods for performing UV treatment and chemical treatment and/or deposition in the same chamber. One embodiment of the present invention provides a processing chamber including a UV transparent gas distribution showerhead disposed above a substrate support located in an inner volume of the processing chamber, a UV transparent window disposed above the UV transparent gas distribution showerhead, and a UV unit disposed outside the inner volume. The UV unit is configured to direct UV lights towards the substrate support through the UV transparent window and the UV transparent gas distribution showerhead.

20 Claims, 8 Drawing Sheets

Related U.S. Application Data

(60) Provisional application No. 61/473,577, filed on Apr. 8, 2011.

(51) Int. Cl.
  *C23C 16/02* (2006.01)
  *C23C 16/455* (2006.01)
  *C23C 16/54* (2006.01)
  *C23C 16/48* (2006.01)

(52) U.S. Cl.
  CPC .... *C23C 16/4404* (2013.01); *C23C 16/45565* (2013.01); *C23C 16/54* (2013.01); *C23C 16/4558* (2013.01); *C23C 16/48* (2013.01); *C23C 16/481* (2013.01)

(56) References Cited

U.S. PATENT DOCUMENTS

| | | |
|---|---|---|
| 4,411,931 A | 10/1983 | Duong |
| 4,849,640 A | 7/1989 | Kruishoop |
| 5,136,491 A | 8/1992 | Kano |
| 5,156,820 A | 10/1992 | Wong et al. |
| 5,184,053 A | 2/1993 | Maruo et al. |
| 5,228,206 A | 7/1993 | Grant et al. |
| 5,440,137 A | 8/1995 | Sowers |
| 5,502,310 A | 3/1996 | Niestrath et al. |
| 5,705,232 A | 1/1998 | Hwang et al. |
| 5,973,331 A | 10/1999 | Stevens et al. |
| 6,015,503 A | 1/2000 | Butterbaugh et al. |
| 6,098,637 A | 8/2000 | Parke |
| 6,264,802 B1 | 7/2001 | Kamrukov et al. |
| 6,284,050 B1 | 9/2001 | Shi et al. |
| 6,323,601 B1 | 11/2001 | Klein et al. |
| 6,331,480 B1 | 12/2001 | Tsai et al. |
| 6,342,702 B1 | 1/2002 | Jinbo et al. |
| 6,348,669 B1 | 2/2002 | Rudd Little et al. |
| 6,380,270 B1 | 4/2002 | Yates |
| 6,457,846 B2 | 10/2002 | Cook et al. |
| 6,475,930 B1 | 11/2002 | Junker et al. |
| 6,559,460 B1 | 5/2003 | Keogh et al. |
| 6,566,278 B1 | 5/2003 | Harvey et al. |
| 6,614,181 B1 | 9/2003 | Harvey et al. |
| 6,619,819 B2 | 9/2003 | Stowell et al. |
| 6,621,087 B1 | 9/2003 | Bisges et al. |
| 6,696,801 B2 | 2/2004 | Schmitkons et al. |
| 6,717,161 B1 | 4/2004 | Cekic et al. |
| 6,732,451 B2 | 5/2004 | Conwell et al. |
| 6,756,085 B2 | 6/2004 | Waldfried et al. |
| 6,894,285 B2 | 5/2005 | Kleinschmidt et al. |
| 7,077,547 B2 | 7/2006 | Schmitkons et al. |
| 7,119,904 B2 | 10/2006 | Coffin et al. |
| 7,126,687 B2 | 10/2006 | Hill et al. |
| 7,148,480 B2 | 12/2006 | Zhan et al. |
| 7,362,416 B2 | 4/2008 | Ito et al. |
| 7,411,203 B2 | 8/2008 | Fomenkov et al. |
| 7,449,704 B2 | 11/2008 | Fomenkov et al. |
| 7,499,154 B2 | 3/2009 | Stock et al. |
| 7,566,891 B2 | 7/2009 | Rocha-Alvarez et al. |
| 7,589,336 B2 | 9/2009 | Kaszuba et al. |
| 7,692,171 B2 | 4/2010 | Kaszuba et al. |
| 7,777,198 B2 | 8/2010 | Rocha-Alvarez et al. |
| 7,909,595 B2 | 3/2011 | Kaszuba et al. |
| 8,203,126 B2 | 6/2012 | Rocha-Alvarez et al. |
| 9,364,871 B2 | 6/2016 | Baluja et al. |
| 2001/0052321 A1 | 12/2001 | Horiguchi et al. |
| 2005/0032293 A1* | 2/2005 | Clark ........ H01L 21/02063 438/222 |
| 2005/0064298 A1 | 3/2005 | Silverman |
| 2005/0156063 A1 | 7/2005 | Tsuji et al. |
| 2006/0249078 A1 | 11/2006 | Nowak et al. |
| 2006/0249175 A1 | 11/2006 | Nowak et al. |
| 2006/0251827 A1* | 11/2006 | Nowak ........ B05D 3/0209 427/558 |
| 2007/0228289 A1 | 10/2007 | Kaszuba et al. |
| 2007/0228618 A1 | 10/2007 | Kaszuba et al. |
| 2007/0257205 A1 | 11/2007 | Rocha-Alvarez et al. |
| 2007/0286963 A1 | 12/2007 | Rocha-Alvarez et al. |
| 2007/0287091 A1 | 12/2007 | Jacobo et al. |
| 2007/0289534 A1* | 12/2007 | Lubomirsky ........ C23C 16/452 118/723 R |
| 2007/0295012 A1 | 12/2007 | Ho et al. |
| 2007/0298167 A1 | 12/2007 | Ho et al. |
| 2008/0067425 A1 | 3/2008 | Kaszuba et al. |
| 2008/0075858 A1 | 3/2008 | Koh |
| 2008/0277600 A1 | 11/2008 | Treichel et al. |
| 2009/0023229 A1 | 1/2009 | Matsushita et al. |
| 2009/0305515 A1 | 12/2009 | Ho et al. |
| 2011/0076401 A1 | 3/2011 | Chao et al. |

FOREIGN PATENT DOCUMENTS

| | | |
|---|---|---|
| JP | 06-093454 | 4/1994 |
| JP | H10-079380 | 3/1998 |
| JP | H10-121252 A | 5/1998 |
| JP | H10-154705 A | 6/1998 |
| JP | H10-199874 A | 7/1998 |
| JP | 2001-332465 A | 11/2001 |
| JP | 2003045862 | 2/2003 |
| JP | 2007-318141 A | 12/2007 |
| JP | 2008-075179 | 4/2008 |
| JP | 2009-272595 A | 11/2009 |
| JP | 2010-103151 A | 5/2010 |
| JP | 2005-209771 A | 8/2014 |
| KR | 10-1998-0701132 | 4/1998 |
| WO | 9961680 A1 | 12/1999 |
| WO | 2009137272 A2 | 11/2009 |

OTHER PUBLICATIONS

International Search Report and Written Opinion of the International Searching Authority dated Aug. 30, 2012 in PCT/US2012/032331.
Taiwan Office Action dated Sep. 17, 2015 for Application No. 101112274.
Chinese Office Action dated Jun. 30, 2015 for Application No. 201280017230.8.
Japanese Office Action dated Nov. 4, 2015 for Application No. 2014-503984.
Final Office Action dated Feb. 16, 2016 for U.S. Appl. No. 13/440,720.
Office Action dated Jul. 8, 2015 for U.S. Appl. No. 13/440,720.
Chinese Office Action dated Mar. 2, 2016 for Application No. 201280017230.8.
Korean Office Action (with attached English translation) for Application No. 10-2013-7027650; dated Apr. 19, 2018; 13 total pages.

* cited by examiner

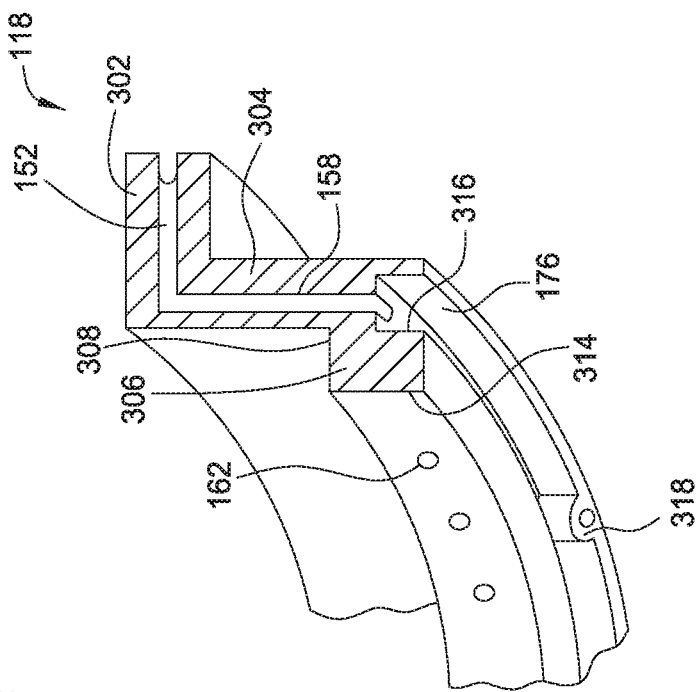
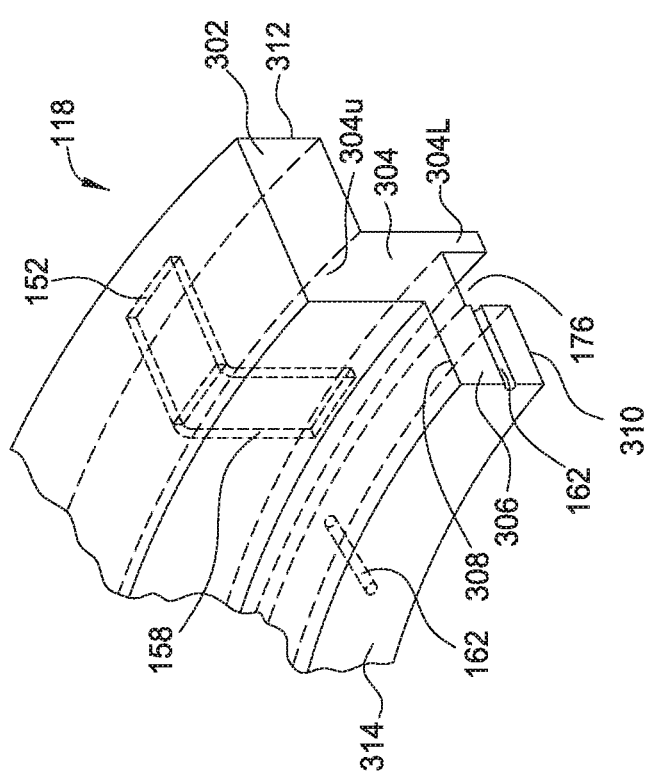

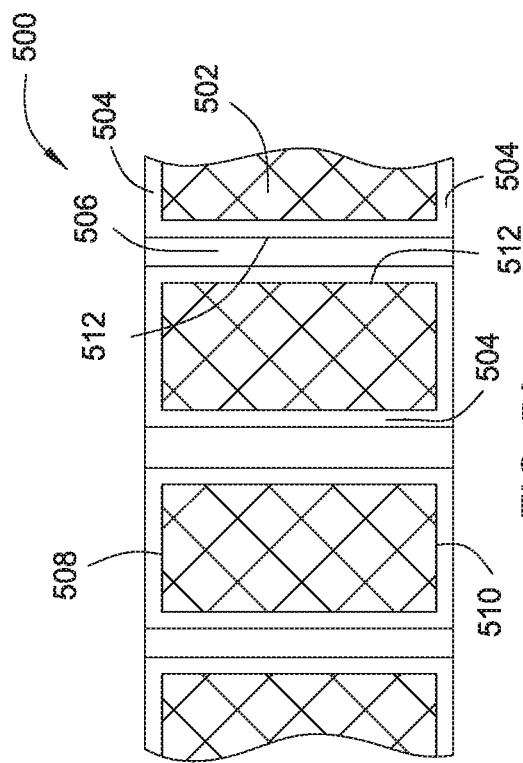
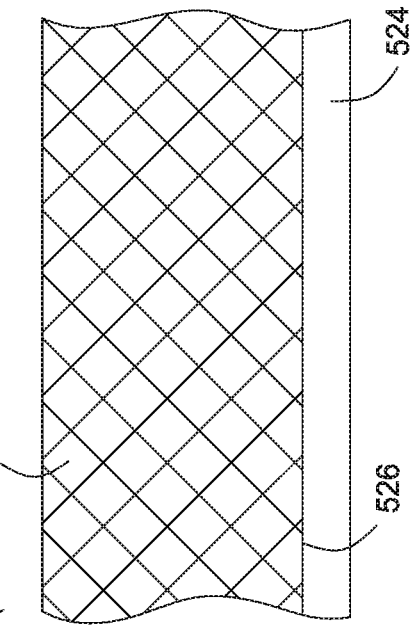
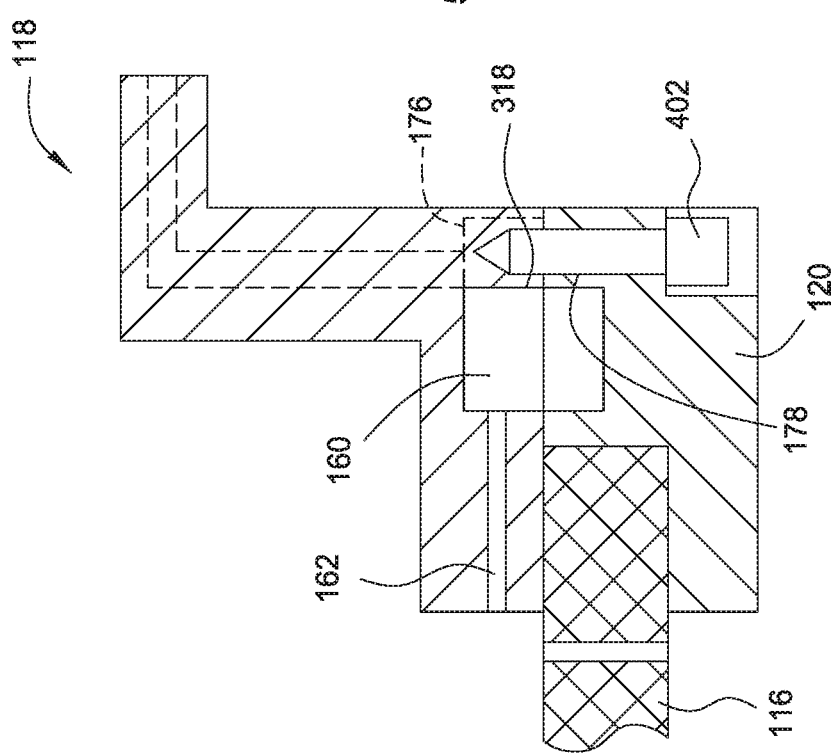
FIG. 5A
FIG. 5B
FIG. 4

APPARATUS AND METHOD FOR UV TREATMENT, CHEMICAL TREATMENT, AND DEPOSITION

CROSS-REFERENCE TO RELATED APPLICATIONS

This application is a divisional of U.S. patent application Ser. No. 13/440,720 filed on Apr. 5, 2012, which claims benefit of U.S. Provisional Patent Application Ser. No. 61/473,577 filed Apr. 8, 2011, which are both herein incorporated by reference.

BACKGROUND

Field

Embodiment of the present invention generally relates to a method and apparatus for fabricating devices on a semiconductor substrate. More particularly, embodiments of the present invention provide apparatus and methods for performing UV treatment and chemical treatment and/or deposition in the same chamber.

Description of the Related Art

As the size of the electronic devices is reduced, new materials with a low dielectric constant (k), such as materials with dielectric value as low as 2.2, are used in forming the electronic devices.

Plasma-deposited porous low k films are one class of materials that is able to satisfy such a requirement. The presence of pores and carbon, which contributes to low dielectric value, creates significant process integration challenges since the pores are susceptible to etching, ashing, and plasma damages. Therefore, a k-restoration process is usually needed to restore the porous low-k films after formation and/or after integration.

Traditionally, two different chambers are needed for k-restoration. One chamber for chemical treatment of the low-k films, such as silylation, or deposition of a thin film for surface treatment of the low-k films. A different chamber is used for pore sealing using UV (ultra violet) curing. Traditional k-restoration is performed in separate chambers because the chemical surface treatment uses a showerhead to supply a processing gas including halogen or ozone while the UV chamber uses a quartz window which usually is not compatible with halogen and ozone. However, the two chamber k-restoration process increases cost of ownership by requiring two chambers and additional time for substrate transfer.

Therefore, there is a need for an improved apparatus and method for k-restoration processes.

SUMMARY

Embodiments of the present invention generally provide apparatus and methods for processing a substrate. Particularly, embodiments of the present inventions provide a processing chamber that is capable of performing UV treatment as well as chemical or surface treatment.

One embodiment of the present invention provides a processing chamber. The processing chamber comprises a chamber body defining an inner volume, a substrate support disposed in the inner volume, and a UV transparent gas distribution showerhead disposed above the substrate support. The processing chamber further comprises a UV transparent window disposed above the UV transparent gas distribution showerhead. A gas volume is formed between the UV transparent gas distribution showerhead and the UV transparent window. The gas volume and the inner volume are in fluid communication through a plurality of through holes formed through the UV transparent gas distribution showerhead. The processing chamber further comprises a UV unit disposed outside the inner volume. The UV unit is configured to direct UV lights towards the substrate support through the UV transparent window and the UV transparent gas distribution showerhead.

Another embodiment of the present invention provides a processing system. The processing system comprises a transfer chamber defining a transfer volume, a substrate transfer robot disposed in the transfer volume, and processing chamber coupled to the transfer chamber. The processing chamber comprises a chamber body defining an inner volume, a substrate support disposed in the inner volume, and a UV transparent gas distribution showerhead disposed above the substrate support. The processing chamber further comprises a UV transparent window disposed above the UV transparent gas distribution showerhead. A gas volume is formed between the UV transparent gas distribution showerhead and the UV transparent window. The gas volume and the inner volume are in fluid communication through a plurality of through holes formed through the UV transparent gas distribution showerhead. The processing chamber further comprises a UV unit disposed outside the UV transparent window. The UV unit is configured to direct UV lights towards the substrate support through the UV transparent window and the UV transparent gas distribution showerhead.

Yet another embodiment of the present invention provides a method for processing a substrate. The method comprises receiving a substrate on a substrate support disposed in a processing chamber. The processing chamber comprises a UV transparent gas distribution showerhead disposed above the substrate support, a UV transparent window disposed above the UV transparent gas distribution showerhead, and a UV unit disposed outside the UV transparent window. The UV unit is configured to direct UV lights towards the substrate support through the UV transparent window and the UV transparent gas distribution showerhead. The method further comprises chemically treating the substrate by flowing one or more processing gas through the UV transparent gas distribution showerhead from a gas volume defined between the UV transparent window and the UV transparent gas distribution showerhead, and curing the substrate by directing a UV energy towards the substrate from the UV unit through the UV transparent gas distribution showerhead and the UV transparent window.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A is a schematic partial perspective view of a clamping member showing gas channel according to one embodiment of the present invention.

FIG. 3B is a schematic partial section view of the clamping member of FIG. 3A.

FIG. 4 is a partial sectional view of a showerhead clamping assembly including a plenum for gas flow.

FIG. 5A is a partial sectional view of a UV transparent showerhead according to one embodiment of the present invention.

FIG. 5B is a partial sectional view of a UV transparent window according to one embodiment of the present invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiment of the present invention generally relates to apparatus and for processing a substrate. More particularly, embodiments of the present invention provide apparatus and methods for performing UV treatment and chemical treatment and/or deposition in the same chamber.

Figure 1:
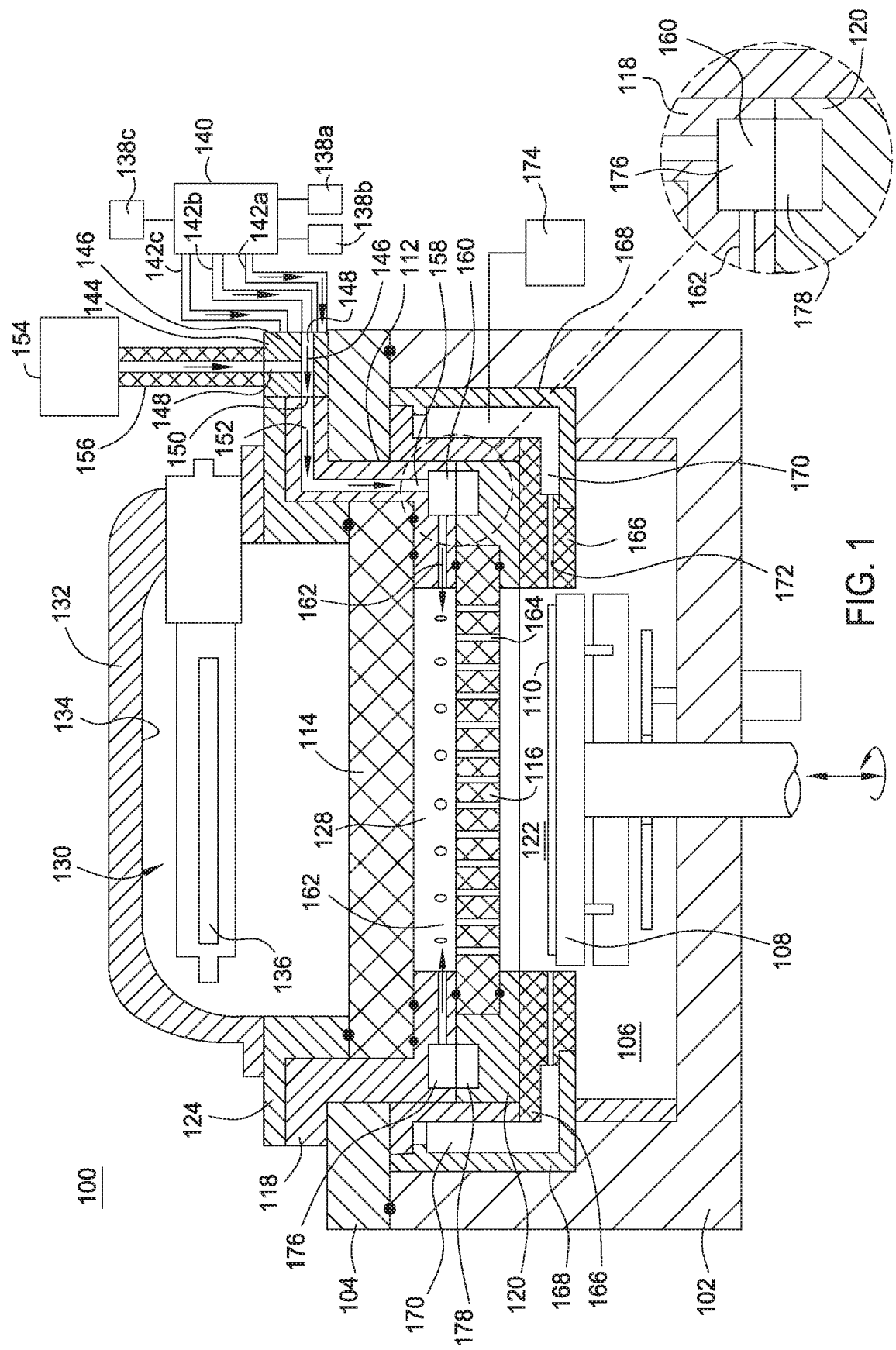
FIG. 1 is a schematic sectional view of a processing chamber according to one embodiment of the present invention.

FIG. 1 is a schematic sectional view of a processing chamber 100 according to one embodiment of the present invention. The processing chamber 100 is configured to process a substrate using UV energy, one or more processing gases, and remotely generated plasma.

The processing chamber 100 includes a chamber body 102 and a chamber lid 104 disposed over the chamber body. The chamber body 102 and the chamber lid 104 form an inner volume 106. A substrate support assembly 108 is disposed in the inner volume 106. The substrate support assembly 108 receives and supports a substrate 110 thereon for processing.

A UV transparent gas distribution showerhead 116 is hung in the inner volume 106 through a central opening 112 of the chamber 104 by an upper clamping member 118 and a lower clamping member 120. The UV transparent gas distribution showerhead 116 is positioned facing the substrate support assembly 108 to distribute one or more processing gases across a processing volume 122 which is below the UV transparent gas distribution showerhead 116 and above the substrate support assembly 108.

A UV transparent window 114 is disposed above the UV transparent gas distribution showerhead 116. In one embodiment, the UV transparent window 114 is supported by the upper clamping member 118 and secured by a window clamping member 124. The window UV transparent 114 is positioned at a distance 126 above the UV transparent gas distribution showerhead 116 forming a gas volume 128 between the UV transparent window 114 and the UV transparent gas distribution showerhead 116.

The UV transparent window 114 and the UV transparent gas distribution showerhead 116 are at least partially transparent to thermal energy within the UV wavelengths.

A UV source 130 is disposed above the UV transparent window 114. The UV source 130 is configured to generate UV energy and project the UV energy towards the processing volume 122 through the UV transparent window 114 and the UV transparent gas distribution showerhead 116. A cover 132 may be disposed above the UV source 130. In one embodiment, the inner surface 134 of the cover 132 may be shaped to assist projection of the UV energy from the UV source 130 towards the processing volume 122.

In one embodiment, the UV source 130 includes one or more UV lights 136 to generate UV radiation. More detailed descriptions of suitable UV sources can be found in U.S. Pat. No. 7,777,198, and United States Patent Publication 2006/0249175.

The processing chamber 100 includes flow channels configured to supply one or more processing gases across the substrate 110 disposed over the substrate support assembly 108.

In one embodiment, one or more processing gases are delivered to the processing volume 122 through flow channels formed in the upper clamping member 118 and the UV transparent gas distribution showerhead 116.

The processing chamber 100 includes a gas panel 140 configured to generate and/or mix processing gases from one or more liquid sources 138a, 138b, 138c. The gas panel 140 is coupled to an input manifold 144 via one or more gas lines 142a, 142b, 142c. In one embodiment, the one or more gas lines 142a, 142b, 142c are heated to prevent any condensation of the processing gas therein during transfer. In one embodiment, the gas panel 140 is configured to provide one or more processing gases for chemical treatments of the substrate 110 disposed in the processing volume 122.

The processing chamber 100 also include a remote plasma source 154 connected to the input manifold 144 via a plasma channel 156. In one embodiment, the remote plasma source 154 may be used to supply plasma for cleaning inner surfaces of the processing chamber 100.

The input manifold 144 has internal channels 146 connecting one or more feedthroughs 148 to an outlet 150. In one embodiment, each gas line 142a, 142b, 142c and the plasma channel 156 is coupled to one of the feedthroughs 148. The input manifold 144 may be disposed over the chamber lid 104 and coupled to the upper clamping member 118 so that the outlet 150 connects to a feeding slot 152 formed in the upper clamping member 118. The input manifold 144 may be machined from a suitable material, such as metals. In one embodiment, the input manifold 144 is machined from aluminum.

In one embodiment, flow channels are formed in the upper clamping member 118 so that the processing gas from the input manifold 144 enters the gas volume 128 above the UV transparent gas distribution showerhead 116 in a substantially even manner. The processing gas can then flow through the UV transparent gas distribution showerhead 116 to the processing volume 122.

In one embodiment, the flow channels in the upper clamping member 118 include an inlet plenum 160, a vertical slot 158 connecting the inlet plenum 160 to the feeding slot 152, and a plurality of spoke apertures 162 connecting the inlet plenum 160 to the gas volume 128. In one embodiment, the plurality of spoke apertures 162 are evenly distributed along the inlet plenum 160 to achieve even gas distribution within the gas volume 128. In one embodiment, the inlet plenum 160 is formed by a groove 176 of the upper clamping member 118 and a groove 178 of the lower clamping member 120. By combining volumes from the grooves 176 and 178, the volume of the inlet plenum 160 is increased without changing dimensions of the upper clamping member 118 and lower clamping member 120. By increasing the volume of the inlet plenum 160, embodiments of the present invention reduce the pressure drop of the incoming gas flow.

The UV transparent gas distribution showerhead 116 includes a plurality of through holes 164 that allow processing gas to flow from the gas volume 128 to the processing volume 122. In one embodiment, the plurality of through holes 164 are evenly distributed across the UV transparent gas distribution showerhead 116.

The processing chamber 100 also includes an inner liner 166 and an outer liner 168 disposed in the inner volume 106 around the substrate support assembly 108. The inner liner 166 and the outer liner 168 shield the chamber body 102 from processing chemistry in the inner volume 106. The inner liner 166 and outer liner 168 also form an exhaust path for the processing chamber 100. In one embodiment, an exhaust plenum 170 is formed between the inner liner 166 and the outer liner 168. The exhaust plenum 170 radially surrounds the processing volume 122. A plurality of apertures 172 are formed through the inner liner 166 connecting the exhaust plenum 170 and the processing volume 122. A vacuum pump 174 is in fluid communication with the exhaust plenum 170 so that the processing volume 122 can be pumped out through the plurality apertures 172 and the exhaust plenum 170.

Figure 2:
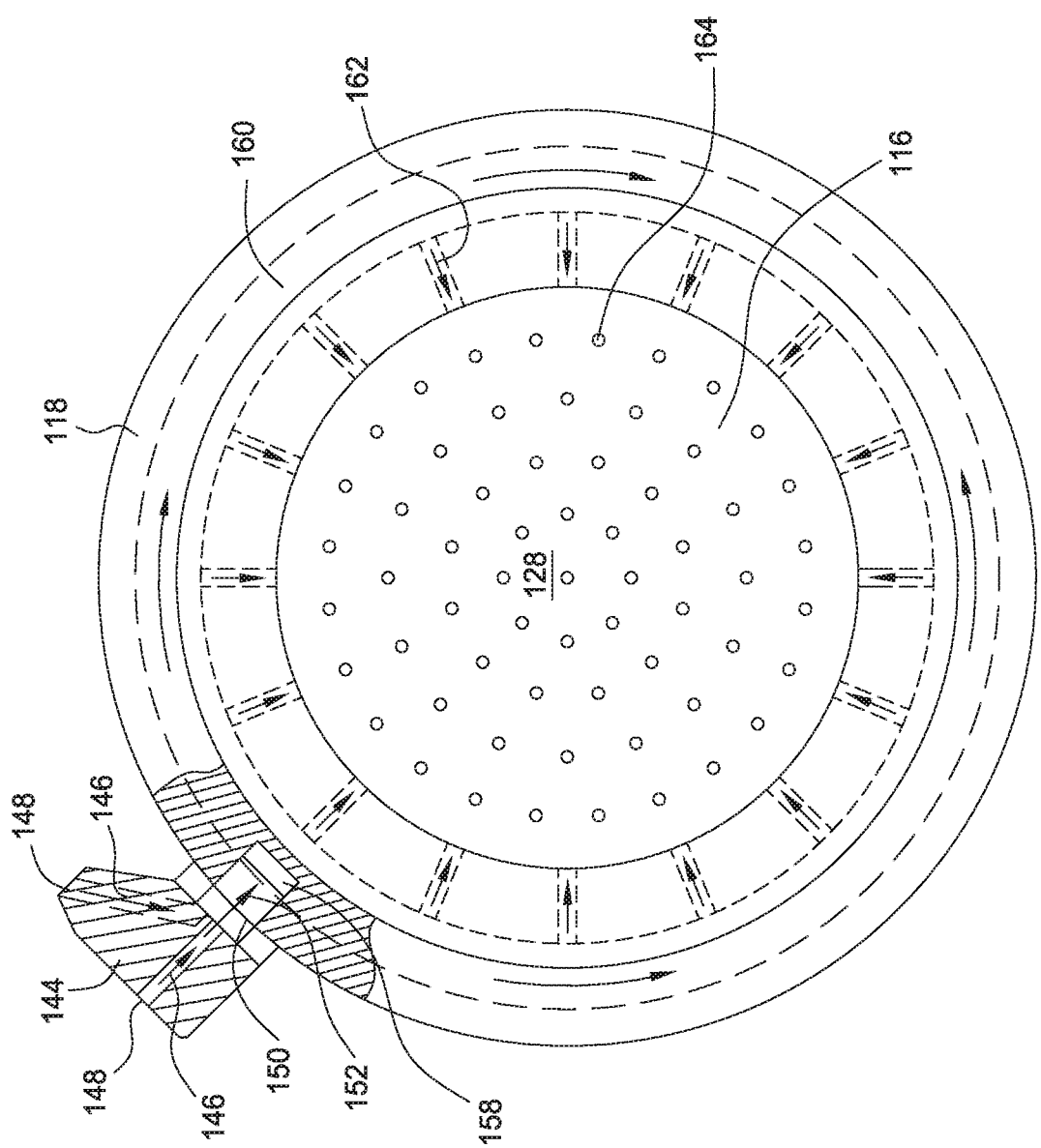
FIG. 2 is a schematic top view of the processing chamber of FIG. 1 with a UV unit and a window removed.

FIG. 2 is a schematic top view of the processing chamber 100 with the UV source 130 and the UV transparent window 114 removed. The arrows illustrate the flow path from the input manifold 144 to the gas volume 128.

FIG. 3A is a schematic partial perspective view of the upper clamping member 118 showing gas channels in dotted lines. FIG. 3B is a schematic partial perspective view of the upper clamping member 118 from a different angle. The upper clamping member 118 includes a ring shaped body 304, a flange 302 extending radially outward from an upper portion 304u of the ring shaped body 304, and a lower step 306 extending radially inward from a lower portion 304L of the ring shaped body 304. The flange 302 allows the upper clamping member 118 to mount on a chamber body with a circular top opening. The step 306 has a top surface 308 for supporting a window therein.

The feeding slot 152 is formed in the flange 302 and opens to an outer surface 312 of the flange 302. The groove 176 is formed from a bottom surface 310 of the step 306. The vertical slot 158 connects the feeding slot 152 to the groove 176. The plurality of spoke apertures 162 are formed in the step 306 between an inner surface 314 of the step 306 and an inner wall 316 of the groove 176. During processing, the processing gas enters the feed slot 152, passes through the vertical slot 158, expands in the groove 176, and then flows through the plurality of spoke apertures 162. In one embodiment, the feeding slot 152 and the vertical slot 158 are elongated in the direction perpendicular to the flow to increase the size of the flow channel within the upper clamping member 118. By increasing the size of the feeding slot 152 and the vertical slot 158, pressure drop in the gas flow can be reduced.

In one embodiment, two or more columns 318 may be formed in the groove 176. The columns 318 are used to attach the lower clamping member 120.

FIG. 4 is a schematic partial sectional view of showing that the lower clamping member 120 is attached to the upper clamping member 118 at the column 318 by one or more screws 402. FIG. 4 also illustrates that the inlet plenum 160 are formed by matching grooves 176, 178 of the upper clamping member 118 and lower clamping member 120. By including volumes from both the upper and lower clamping members 118, 120, volume of the inlet plenum 160 is increased without changing other dimensions of the chamber components. The increased volume of the inlet plenum 160 further reduces pressure drop in the flow path during processing.

As discussed above, the processing chamber 100 is capable of performing both chemical or surface treatment and UV treatment. For example, in the embodiment shown in FIG. 1, a UV treatment to the substrate 110 disposed on the processing volume 122 can be performed by delivering UV energy from the UV source 130 through the UV transparent window 114 and the UV transparent gas distribution showerhead 116.

A chemical treatment to the substrate 110 disposed in the processing volume 122 can be performed by supplying one or more processing gases from the gas panel 140 to the processing volume 122 through a flow path including the UV transparent gas distribution showerhead 116. In the embodiment shown in FIG. 1, the flow path include the plasma channel 156, the internal channels 146 in the input manifold 144, the feeding slot 152, the vertical slot 158, the inlet plenum 160, the plurality of spoke apertures 162, the gas volume 128, and the plurality of through holes 164 in the UV transparent gas distribution showerhead 116. The UV transparent gas distribution showerhead 116 and the UV transparent window 114 are not only substantially transparent to lights within the UV wavelength but also resistive to the chemistry in the processing gas.

FIG. 5A is a partial sectional view of a UV transparent gas distribution showerhead 500 according to one embodiment of the present invention. The UV transparent gas distribution showerhead 500 is substantially transparent to lights within the UV wavelength and resistive against processing chemistry including halogen, such as fluorine, or ozone. The UV transparent gas distribution showerhead 500 may be used in place of the UV transparent gas distribution showerhead 116 in the processing chamber 100.

The UV transparent gas distribution showerhead 500 includes a body 502. The body 502 may shape substantially like a disk having an upper surface 508 and a lower surface 510 substantially parallel to each other. A plurality of through holes 506 are formed through the body 502. The through holes 506 open to the upper surface 508 and the lower surface 510 and are configured to allow a processing gas evenly distributed through the body 502. The body 502 is formed from a material that is substantially transparent to lights within the UV wavelength. In one embodiment, the body 502 is formed from quartz.

The UV transparent gas distribution showerhead 500 also includes a coating 504 covering the upper surface 508, the lower surface 510, and inner surface 512 forming the plurality of through holes 506. The coating 504 protects the body 502 from being damaged by processing gas passing through the through holes 506 without blocking the UV wavelengths. In one embodiment, the coating 504 is resistant against processing chemistry including halogen, such as fluorine, or ozone. The coating 504 may comprise aluminum oxynitride, sapphire, or other suitable materials. The coating 504 may be deposited on the body 502 using common deposition technologies, such as chemical vapor deposition, physical vapor deposition, spraying coating. The thickness of the coating 504 may be selected to be thick enough to provide protection to the body 502 without affecting UV transparency of the body 502. In one embodiment, the coating 504 is an aluminum oxynitride film of a thickness up to about 500 micro meters formed by chemical vapor deposition or physical vapor deposition.

FIG. 5B is a partial sectional view of a UV transparent window 520 according to one embodiment of the present invention. Similar to the UV transparent gas distribution showerhead 500, the UV transparent window 520 is also substantially transparent to lights within the UV wavelength and resistive against processing chemistry including halogen, such as fluorine, or ozone. The UV transparent gas distribution showerhead 500 may be used in place of the UV transparent gas distribution showerhead 116 in the processing chamber 100.

The UV transparent window 520 includes a body 522 formed from a UV transparent material and a coating 524 formed at least on a lower surface 526 of the body 522. The body 522 may be formed from any UV transparent material. In one embodiment, the body 522 is formed from quartz. The coating 524 protects the body 522 from being damaged when exposed to a processing gas. In one embodiment, the coating 524 is resistant against processing chemistry including halogen, such as fluorine, or ozone. The coating 524 include aluminum oxynitride, sapphire, or other suitable materials. The coating 524 may be deposited on the body 522 using common deposition technologies, such as chemical vapor deposition, physical vapor deposition, spraying coating. The thickness of the coating 524 may be selected to be thick enough to provide protection to the body 522 without affecting UV transparency of the body 522. In one embodiment, the coating 524 is an aluminum oxynitride film of a thickness up to about 500 micro meters formed by chemical vapor deposition or physical vapor deposition.

Figure 6:
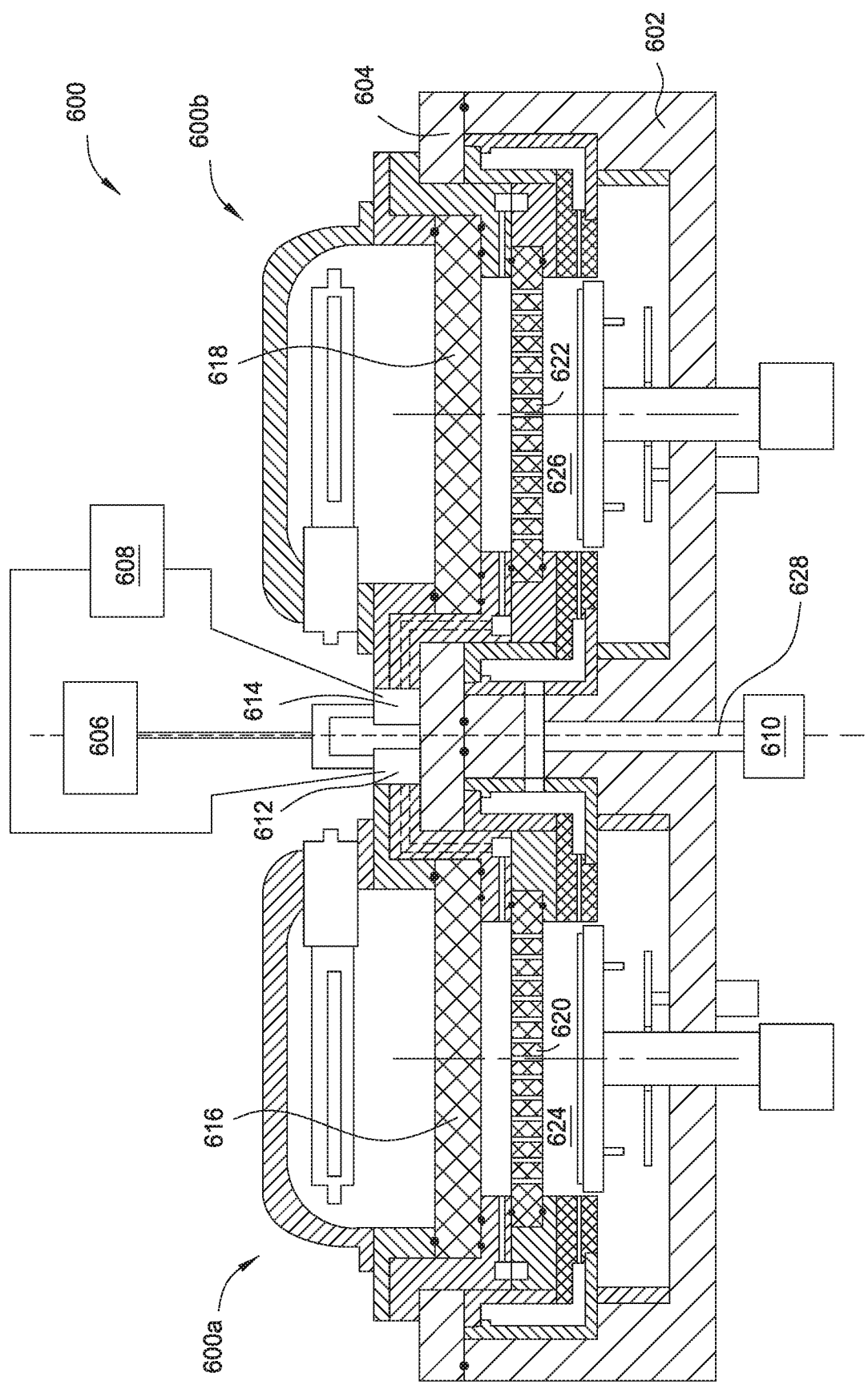
FIG. 6 is a sectional view of a twin volume processing chamber according to one embodiment of the present invention.
Figure 7:
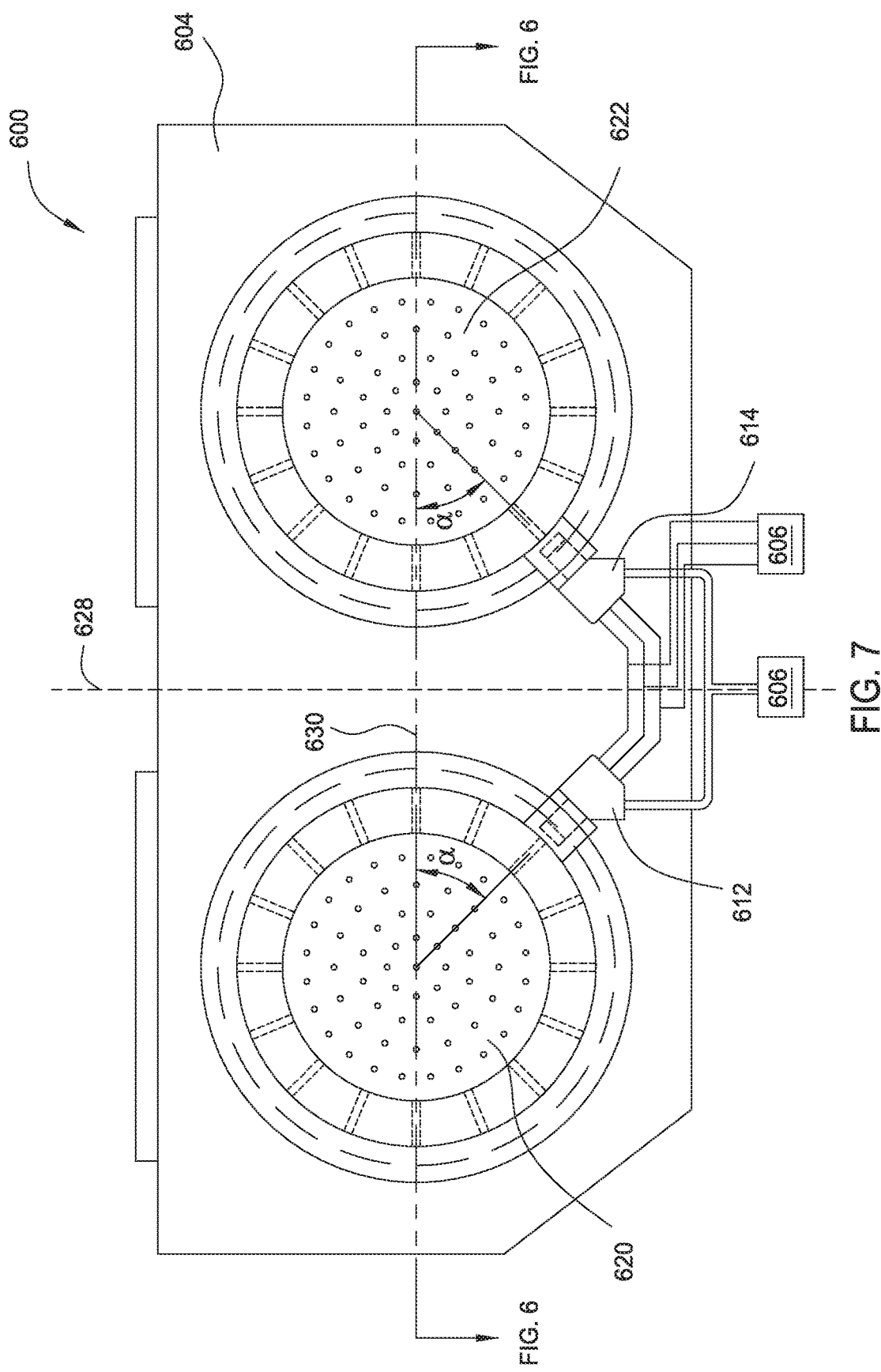
FIG. 7 is a top view of the twin volume processing chambers of FIG. 6.

FIG. 6 is a sectional view of a twin volume processing chamber 600 according to one embodiment of the present invention. FIG. 7 is a top view of the twin volume processing chamber 600. The twin volume processing chamber 600 includes two processing chambers 600a, 600b that are substantially similar to the processing chamber 100 of FIG. 1.

The processing chambers 600a, 600b share a chamber body 602 and a chamber lid 604. The processing chambers 600a, 600b are mirror images of one another about a central plane 628.

The processing chamber 600a defines a processing volume 624 for processing a single substrate. The processing chamber 600a includes a UV transparent window 616 and a UV transparent gas distribution showerhead 620 disposed above the processing volume 624. The processing chamber 600b defines a processing volume 626 for processing a single substrate. The processing chamber 600b includes a UV transparent window 618 and a UV transparent gas distribution showerhead 622 disposed above the processing volume 626.

The processing chambers 600a, 600b share a remote plasma source 606, a gas panel 608, and a vacuum pump 610. The processing chamber 600a is coupled to the remote plasma source 606 and the gas panel 608 via an input manifold 612 and the processing chamber 600b is coupled to the remote plasma source 606 and the gas panel 608 via an input manifold 614. The input manifolds 612, 614 may be positioned so that the distances between the input manifolds 612, 614 to the remote plasma source 606 are minimized to reduce radicals in the plasma from recombination while flowing to the processing volumes 624, 626. In one embodiment, the input manifolds 612, 614 are positioned at locations that are at an angle α from a horizontal line 630. In one embodiment, the angle α is about 45 degrees.

Figure 8:
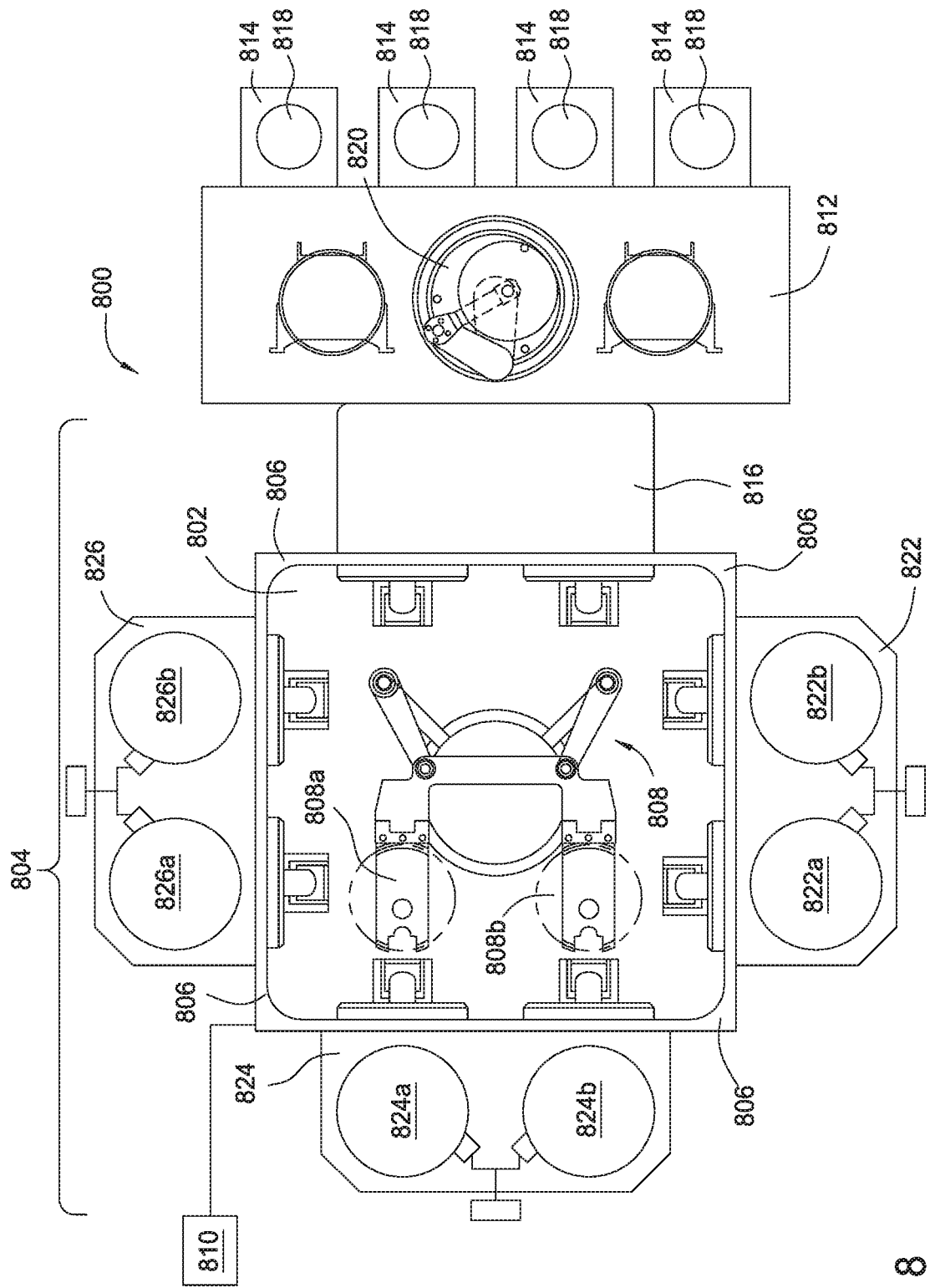
FIG. 8 is a schematic plan view of a processing system according to one embodiment of the present invention.

FIG. 8 is a schematic plan view of a processing system 800 according to one embodiment of the present invention. The processing system 800 includes one or more twin volume processing chambers 600.

The processing system 800 includes a vacuum-tight processing platform 804, a factory interface 812, and a system controller 810. The platform 804 includes a plurality of twin volume processing chambers 822, 824, 826 and a load-lock chamber 816 that are coupled to a transfer chamber 802. In one embodiment, the transfer chamber 802 may have four sides 806. Each side 806 is configured to connect with a twin volume processing chamber 600 or load-lock chamber 816. Three twin volume processing chambers 822, 824, 826 are coupled to three sides 806 of the transfer chamber 802 as shown in FIG. 8.

The factory interface 812 is coupled to the transfer chamber 802 through the dual load-lock chamber 816. In one embodiment, the factory interface 812 includes at least one docking station 814 and at least one factory interface robot 820 to facilitate transfer of substrates. The docking station 814 is configured to accept one or more front opening unified pod (FOUP) 818.

Each of the twin volume processing chambers 822, 824, 826 includes two processing volumes processing volumes 822a, 822b, 824a, 824b, 826a, 826b respectively positioned side by side. Each of the twin volume processing chambers 822, 824, 826 is configured to process two substrates simultaneously. The substrate transfer robot 808 includes two robot blades 808a, 808b arranged side-by-side for transfer two substrates among the twin volume processing chambers 822, 824, 826 and the load-lock chamber 816. This twin volume configuration increases productivity without increasing resources, such as substrate transfer robot, and gas panels for each processing chamber.

In one embodiment, the twin volume processing chambers 822, 824, 826 may have different configurations to perform different processing steps in a processing recipe. Alternatively, the twin volume processing chambers 822, 824, 826 may have the same configuration to perform the same treatments to the substrates.

In one embodiment, at least one of the twin volume processing chambers 822, 824, 826 is substantially similar to the twin volume processing chamber 600 and configured to process two substrates simultaneously in two processing volumes by performing UV treatment and chemical treatment to the substrates, consecutively, alternatively or simultaneously.

Figure 9:
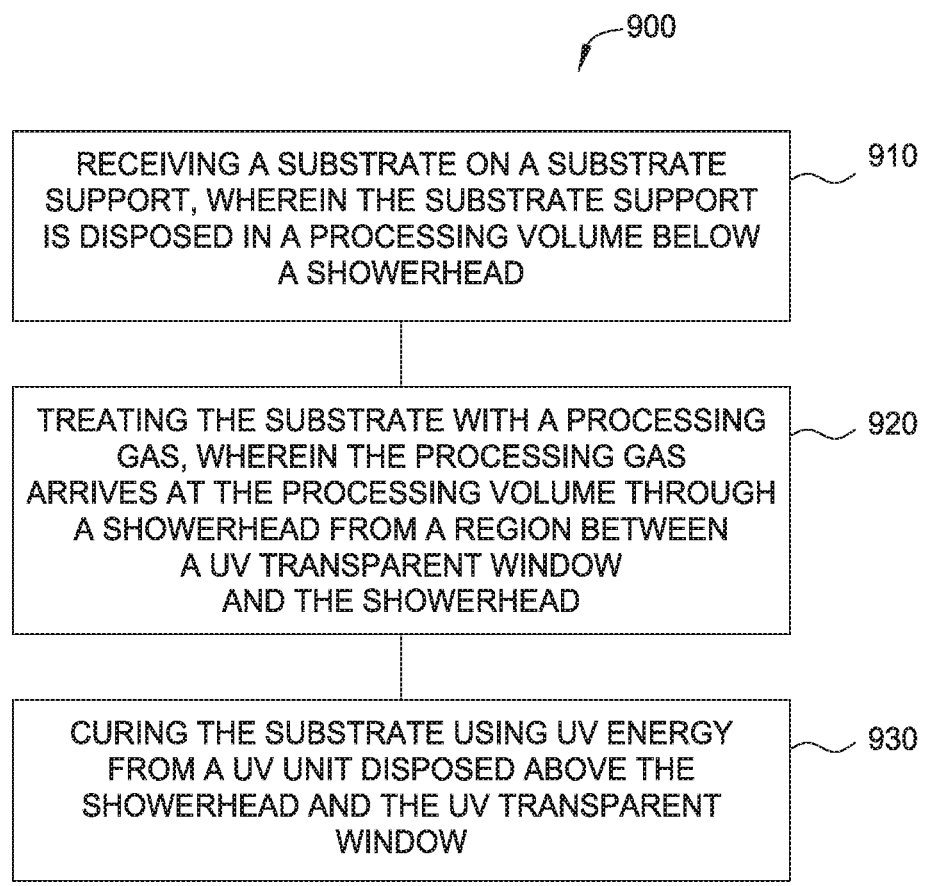
FIG. 9 is a diagram showing a method for processing a substrate according to one embodiment of the present invention.

FIG. 9 is a diagram showing a method 900 for processing a substrate according to one embodiment of the present invention. The method 900 may be performed in a stand-alone processing chamber, such as the processing chamber 100 of FIG. 1, the twin volume process chamber 600 of FIG. 6, or in a processing chamber coupled to a processing system, such as the processing system 800 of FIG. 8 or a processing system including a single volume processing chamber 100 of FIG. 1.

The method 900 is configured to recover low k dielectric material using UV treatment and chemical treatment within the same processing chamber.

For example, the method 900 may be used to perform a one stop recovery for a low k dielectric film based on SiCOH material formed by a plasma-enhanced chemical vapor deposition. Particularly, vapor phase silylation and cure are combined to recover the low k film properties and repair side wall damage. In vapor phase silylation, methyl or phenyl containing silylation compounds react with the Si—OH groups in low k films to convert hydrophilic Si—OH groups into hydrophobic Si—O—Si(CH$_3$)$_3$ groups against moisture uptake, thus decreasing dielectric constant. In UV cure, pores in the low k film are sealed by curing.

In box 910 of method 900, a substrate is received on a substrate support disposed in a processing volume of a processing chamber. In one embodiment, the processing volume is disposed under a UV transparent gas distribution showerhead that is substantially transparent to lights within UV wavelength. The UV transparent gas distribution showerhead allows processing gas for chemical treatment to be distributed across the substrate in a substantially even manner. The UV transparent gas distribution showerhead also allows passages of UV light to enable UV curing of the substrate in the processing volume.

In box 920 of method 900, a chemical treatment is performed by flowing one or more processing gas from the UV transparent gas distribution showerhead above the substrate. In one embodiment, the one or more processing gas is delivered towards the substrate through the UV transparent gas distribution showerhead from a region between a UV transparent window and the UV transparent gas distribution showerhead.

In one embodiment, the chemical treatment is vapor silylation using a silylation agent selected from a group comprising hexamethyldisilazane (HMDS), tetramethyldisilazane (TMDS), trimethylchlorosilane (TMCS), dimethyldichlorosilane (DMDCS), methyltrichlorosilane (MTCS), methyltrichlorosilane (MTCS), trimethylmethoxysilane (TMMS), phenyltrimethoxysilane (PTMOS), phenyldimethylchlorsilane (PDMCS), dimethylaminotrimethylsilane (DMATMS), bis(dimethylam ino)dimethylsilane (BDMADMS), or combinations thereof. In one embodiment, the time during for the vapor silylation may be from about 1 min to about 10 min. The silylation temperature may be from about 100 C to about 400 C. The flow rate of the silylation agent may be between about 0.5 g to about 5 g/min and the chamber pressure may be between about 2 m Torr and about 500 Torr.

In box 930 of the method 900, the substrate is cured in the same processing chamber using UV energy from a UV unit disposed above the UV transparent gas distribution showerhead and the UV transparent window. In one embodiment, the UV cure temperature may be from room temperature to about 400 C. The UV cure time may be from about 10 sec to about 180 sec. A UV cure gas may be flown to the processing chamber through the UV transparent gas distribution showerhead. In one embodiment, an inert cure gas, such as He and Ar, may be flown to the processing chamber at a flow rate between about 8 slm to about 24 slm.

In another embodiment, the silylation in box 920 and UV curing in box 930 can be performed simultaneously. The UV unit turns on/off at the same time with the silylation process. The silylation agent flow rate, UV power, wafer temperature, chamber pressure of silylation and UV cure process, silylation time and UV on time are adjustable.

In another embodiment, the UV cure in box 930 may be performed before silylation treatment in box 920.

In another embodiment, the UV cure in box 930 and the silylation in box 920 can be performed alternately. First, the UV cure is performed to remove some water from surface/side wall. The silylation is performed to recover surface hydrophobicity. The UV cure is then performed to further recover low k film damage. The silylation agent flow rate, UV power, wafer temperature, chamber pressure of silylation and UV cure process, silylation time and UV on time are adjustable.

In yet another embodiment, the silylation in box 920 and the UV cure in box 930 are performed in a pulsed in-situ manner. The silylation treatment is performed in a pulse of about 5-10 seconds followed by a pulse of UV cure for about 5-10 seconds.

Embodiments of the present invention provide apparatus and methods for performing chemical treatment and UV curing for low-k film recovery in a single chamber. Embodiments of the present invention also enable plasma cleaning of the UV curing chamber by including a remote plasma source. As a result, costs of production are reduced by reducing the number of chambers used. Efficiency of the product is increased by eliminating substrate transfer and additional chamber pump outs. Additionally, embodiments of the present invention also enables incorporating various treatment features and functions within a minimum space, thereby, enabling cost-effective implementation of k-recovery in a manufacturing environment.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
receiving a substrate on a substrate support disposed in an inner volume of a processing chamber, wherein the processing chamber comprises:
 a gas distribution showerhead formed of a UV transparent material disposed above the substrate support, wherein the gas distribution showerhead comprises a plurality of holes for supplying gas to the inner volume;
 a UV transparent window disposed above the gas distribution showerhead, wherein a gas volume is formed between the gas distribution showerhead and the UV transparent window, and the gas volume and the inner volume are in fluid communication through the gas distribution showerhead;
 a UV lamp disposed outside the inner volume, wherein the UV lamp is configured to direct UV light towards the substrate support through the UV transparent window and the gas distribution showerhead;
 an upper clamp disposed in an upper opening of a chamber body, wherein the upper clamp is disposed between the gas distribution showerhead and the UV transparent window, and a gas flow path is formed within the upper clamp; and
 a lower clamp, wherein the gas distribution showerhead is clamped between the upper clamp and the lower clamp, an inlet plenum is formed between the upper clamp and the lower clamping member, and an exhaust plenum surrounds the gas distribution showerhead;
chemically treating the substrate by flowing one or more processing gases through the gas distribution showerhead from the gas volume defined between the UV transparent window and the gas distribution showerhead; and
curing the substrate by directing UV energy towards the substrate from the UV lamp through the gas distribution showerhead and the UV transparent window.

2. The method of claim 1, wherein chemically treating the substrate lowers a dielectric constant of a film formed on the substrate.

3. The method of claim 1, wherein chemically treating the substrate comprises flowing one or more processing gases comprising a silylation agent for chemically treating a low k film formed on the substrate.

4. The method of claim 3, wherein the chemical treating and the curing are performed simultaneously.

5. The method of claim 3, wherein the chemical treating is performed before the curing.

6. The method of claim 3, wherein the curing is performed before the chemical treating.

7. The method of claim 3, wherein the chemical treating and curing are performed in a pulsed manner, wherein a pulse of chemical treating is followed by a pulse of curing.

8. The method of claim 3, wherein a UV cure gas is provided to the process chamber during the curing of the substrate.

9. The method of claim 1, wherein the chemical treating and the curing are performed when the substrate is on the substrate support.

10. A method for processing a substrate, comprising:
positioning a substrate on a substrate support disposed in an inner volume of a processing chamber;
chemically treating the substrate on the substrate support to lower a dielectric constant of a film formed on the substrate by flowing one or more processing gases into an inner volume of the processing chamber by introducing the one or more processing gases into a gas volume defined between a gas distribution showerhead formed of a UV transparent material and a UV transparent window, wherein the one or more processing gases are introduced to the gas volume through a gas flow path formed within an upper clamp, wherein the one or more processing gases flow from the gas volume to the inner volume through a plurality of holes of the gas distribution showerhead, and wherein the gas distribution showerhead is clamped between the upper clamp and a lower clamp, an inlet plenum is formed between the upper clamp and the lower clamp, and an exhaust plenum surrounds the gas distribution showerhead; and
curing the substrate on the substrate support by directing UV energy towards the substrate through the UV transparent window and the gas distribution showerhead from a UV lamp disposed outside the inner volume.

11. The method of claim 10, wherein chemically treating the substrate comprises flowing one or more processing gases comprising a silylation agent for chemically treating a low k film formed on the substrate.

12. The method of claim 10, wherein the chemical treating and the curing are performed simultaneously.

13. The method of claim 10, wherein the curing is performed before the chemical treating.

14. The method of claim 10, wherein the chemical treating and curing are performed in a pulsed manner, wherein a pulse of chemical treating is followed by a pulse of curing.

15. The method of claim 10, wherein a UV cure gas is provided to the process chamber during the curing of the substrate.

16. A method for processing a substrate, comprising:
receiving a substrate on a substrate support disposed in an inner volume of a processing chamber;
depositing a film on the substrate in the processing chamber;
chemically treating the substrate in the processing chamber to lower a dielectric constant of the film deposited on the substrate by flowing one or more processing gases into an inner volume of the processing chamber by introducing the one or more processing gases into a gas volume defined between a gas distribution showerhead formed of a UV transparent material and a UV transparent window, wherein the one or more processing gases are introduced to the gas volume through a gas flow path formed within an upper clamp, wherein the one or more processing gases flow from the gas volume to the inner volume through a plurality of holes of the gas distribution showerhead, and wherein the gas distribution showerhead is clamped between the upper clamp and a lower clamp, an inlet plenum is formed between the upper clamp and the lower clamp, and an exhaust plenum surrounds the gas distribution showerhead; and
curing the substrate in the processing chamber by directing UV energy towards the substrate through the UV transparent window and the gas distribution showerhead from a UV lamp disposed outside the inner volume.

17. The method of claim 16, wherein chemically treating the substrate comprises flowing one or more processing gases comprising a silylation agent for chemically treating a low k film formed on the substrate.

18. The method of claim 16, wherein the chemical treating and the curing are performed simultaneously.

19. The method of claim 16, wherein the substrate is on the substrate support during the depositing, chemically treating, and curing.

20. The method of claim 16, wherein the chemical treating and curing are performed in a pulsed manner, wherein a pulse of chemical treating is followed by a pulse of curing.

* * * * *